US012727452B2

(12) United States Patent
Lai

(10) Patent No.: US 12,727,452 B2
(45) Date of Patent: Sep. 1, 2026

(54) SEMICONDUCTOR DEVICE AND METHOD OF MANUFACTURING THE SAME

(71) Applicant: NANYA TECHNOLOGY CORPORATION, New Taipei city (TW)

(72) Inventor: Jen-I Lai, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 528 days.

(21) Appl. No.: 18/208,142

(22) Filed: Jun. 9, 2023

(65) Prior Publication Data

US 2024/0413005 A1 Dec. 12, 2024

(51) Int. Cl.

| | |
|---|---|
| ***H10W 10/00*** | (2026.01) |
| ***H10P 30/40*** | (2026.01) |
| ***H10P 50/28*** | (2026.01) |
| ***H10P 95/00*** | (2026.01) |
| ***H10W 10/17*** | (2026.01) |

(52) U.S. Cl.

CPC ........... *H10W 10/014* (2026.01); *H10P 30/40* (2026.01); *H10P 50/283* (2026.01); *H10P 95/06* (2026.01); *H10W 10/17* (2026.01)

(58) Field of Classification Search

CPC ......... H01L 21/76224; H01L 21/31051; H01L 21/31116; H01L 21/31155

See application file for complete search history.

(56) References Cited

U.S. PATENT DOCUMENTS

| | | | | |
|---|---|---|---|---|
| 2011/0081765 A1* | 4/2011 | Cummings | ....... | H01L 21/76229 257/E21.546 |
| 2012/0187524 A1* | 7/2012 | Huang | .............. | H01L 21/76224 257/E21.546 |
| 2019/0109039 A1* | 4/2019 | Dong | ................... | H10D 64/117 |
| 2021/0193529 A1* | 6/2021 | Ma | ....................... | H10D 62/115 |

FOREIGN PATENT DOCUMENTS

| | | |
|---|---|---|
| TW | I763114 | 5/2022 |

OTHER PUBLICATIONS ip.com search. (Year: 2026).*

* cited by examiner

*Primary Examiner* — Zandra V Smith
*Assistant Examiner* — Andre C Stevenson
(74) *Attorney, Agent, or Firm* — CKC & Partners Co., LLC

(57) ABSTRACT

The present disclosure provides a method of manufacturing a semiconductor device. The method includes: providing a semiconductor structure, in which the semiconductor structure comprises a silicon substrate having a plurality of trenches and an oxide material filled in the trenches and covering the silicon substrate, and the trenches define a plurality of island structures; forming a pad oxide layer on a top portion of the oxide material, in which the pad oxide layer is located over the silicon substrate; and removing the pad oxide layer, so that a top surface of the oxide material and a top surface of the island structures are coplanar.

15 Claims, 8 Drawing Sheets

100A

M

SEMICONDUCTOR DEVICE AND METHOD OF MANUFACTURING THE SAME

BACKGROUND

Field of Invention

The present disclosure relates to a semiconductor device and a method of manufacturing the same.

Description of Related Art

With the evolution of generations of semiconductor processes, there will be challenges of a semiconductor structure in a memory device. Regarding semiconductor devices, the process related to active area in dynamic-random access memory (DRAM) is pivotal, because it determines the performance and yield enhancement of the semiconductor devices.

However, conventional methods bring out rounding scheme of the active area. This may lead to less contact area where the active area in contact with contacts, thereby causing deterioration of electrical performance of the semiconductor devices. Based on previous experiments, although decreasing the time of wet cleaning the active area may mitigate the rounding issue of the active area, the shallow trench isolation (STI) loss issue remains unsolved.

SUMMARY

In view of this, one purpose of present disclosure is to provide a semiconductor device and a method of manufacturing the same that can solve the aforementioned problems.

In order to achieve the above objective, according to an embodiment of the present disclosure, a method of manufacturing a semiconductor device includes: providing a semiconductor structure, in which the semiconductor structure comprises a silicon substrate having a plurality of trenches and an oxide material filled in the trenches and covering the silicon substrate, and the trenches define a plurality of island structures; forming a pad oxide layer on a top portion of the oxide material, in which the pad oxide layer is located over the silicon substrate; and removing the pad oxide layer, so that a top surface of the oxide material and a top surface of the island structures are coplanar.

In one or more embodiments of the present disclosure, each of the island structures has a width in a range between 20 nm and 30 nm.

In one or more embodiments of the present disclosure, forming the pad oxide layer is performed by an ion implantation process.

In one or more embodiments of the present disclosure, forming the pad oxide layer is performed by implanting carbon ion into the top portion of the oxide material.

In one or more embodiments of the present disclosure, the pad oxide layer is formed on the top portion of the oxide material in situ.

In one or more embodiments of the present disclosure, forming the pad oxide layer is performed such that a top surface of the pad oxide layer has a thickness in a range between 20 nm and 30 nm.

In one or more embodiments of the present disclosure, the method of manufacturing a semiconductor device further comprises planarizing the semiconductor structure performed after providing the semiconductor structure.

In one or more embodiments of the present disclosure, planarizing the semiconductor structure is performed such that the top surface of the oxide material is paralleled to the top surface of the island structures.

In one or more embodiments of the present disclosure, providing the semiconductor structure further comprises forming a filling material on the oxide material.

In one or more embodiments of the present disclosure, forming the filling material on the oxide material is performed such that the trenches are completely filled by the oxide material and the filling material.

In one or more embodiments of the present disclosure, the filling material is composed of nitride.

In one or more embodiments of the present disclosure, the method of manufacturing a semiconductor device further comprises planarizing the semiconductor structure performed after forming the filling material.

In one or more embodiments of the present disclosure, planarizing the semiconductor structure is performed such that the top surface of the oxide material and a top surface of the filling material are coplanar.

In one or more embodiments of the present disclosure, removing the pad oxide layer is performed by a wet etch process.

In one or more embodiments of the present disclosure, removing the pad oxide layer is performed by using hydrofluoric acid.

In order to achieve the above objective, according to an embodiment of the present disclosure, a semiconductor device includes a silicon substrate and an oxide material. The silicon substrate has a plurality of trenches, and the trenches define a plurality of island structures. The oxide material is filled in the trenches, such that a top surface of the oxide material and a top surface of the island structures are coplanar. Each of the island structures further has a side surface and a rounded edge connected between the top surface and the side surface. A radius of curvature of the rounded edge is equal or less than 2.3 nm.

In one or more embodiments of the present disclosure, the top surface of the oxide material and the top surface of the island structures are coplanar.

In one or more embodiments of the present disclosure, each of the island structures has a width in a range between 20 nm and 30 nm.

In one or more embodiments of the present disclosure, the semiconductor device further comprises a filling material on the oxide material.

In one or more embodiments of the present disclosure, the filling material and the oxide material completely fill the trenches.

In summary, the semiconductor device and the method of manufacturing the same of the present disclosure provides island structures without rounding issues. In the semiconductor device and the method of manufacturing the same of the present disclosure, since the pad oxide layer is formed on the top of the semiconductor structure and covering the island structures, the loss of the oxide material can be reduced, thereby prevent rounding of the island structures. In the semiconductor device and the method of manufacturing the same of the present disclosure, since the pad oxide layer is formed on the top portion of the oxide material in situ, additional material is not required, thereby improving the electrical performance of the entire semiconductor device. To sum up, the method of manufacturing the semiconductor device of the present disclosure improves the overall electrical performance of the entire semiconductor device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
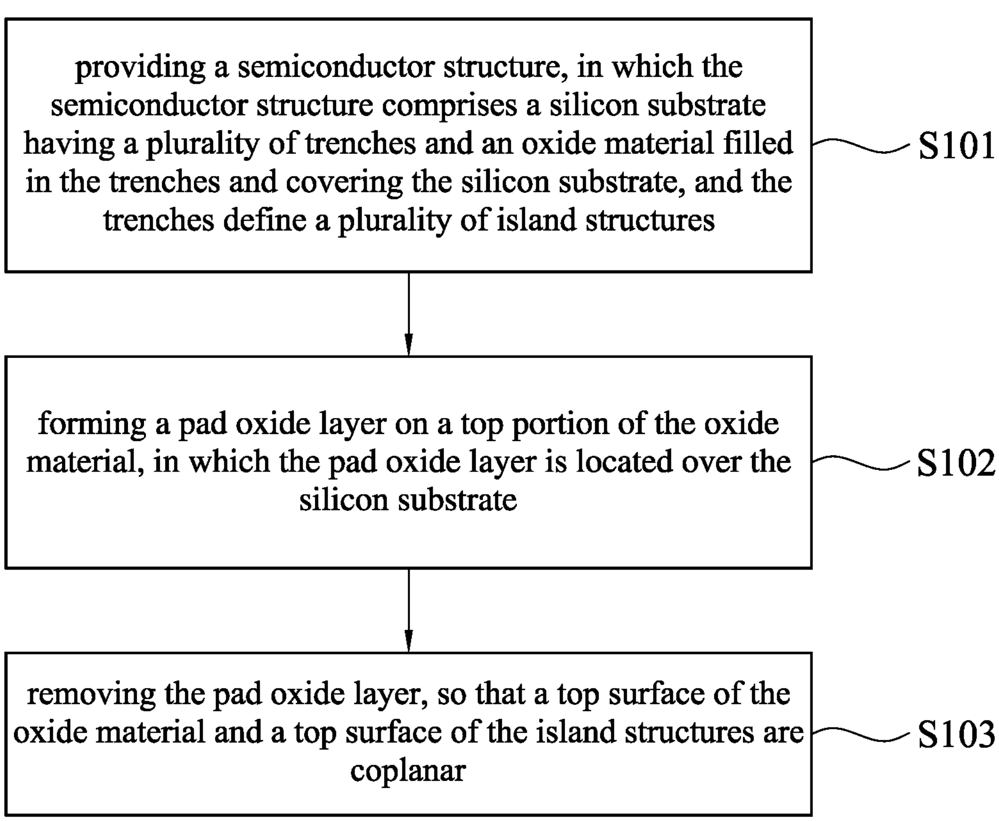
FIG. 1 is a flow chart of a method of manufacturing a semiconductor device in accordance with an embodiment of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around,” “about,” “approximately,” or “substantially” shall generally mean within 20 percent, or within 10 percent, or within 5 percent of a given value or range. Numerical quantities given herein are approximate, meaning that the term “around,” “about,” “approximately,” or “substantially” can be inferred if not expressly stated.

Reference is made to FIG. 1. FIG. 1 is a flow chart of a method M of manufacturing a semiconductor device 100 as shown in FIG. 6 and a semiconductor device 100A as shown in FIG. 7 in accordance with an embodiment of present disclosure. The method M shown in FIG. 1 includes a step S101, a step S102, and a step S103. Please refer to FIG. 1, FIG. 2, and FIG. 3 for better understanding the step S101, refer to FIG. 1 and FIG. 4 for better understanding the step S102, refer to FIG. 1, FIG. 5, FIG. 6, FIG. 7, and FIG. 8 for better understanding the step S103.

Step S101, step S102, and step S103 are described in detail below.

Figure 2:
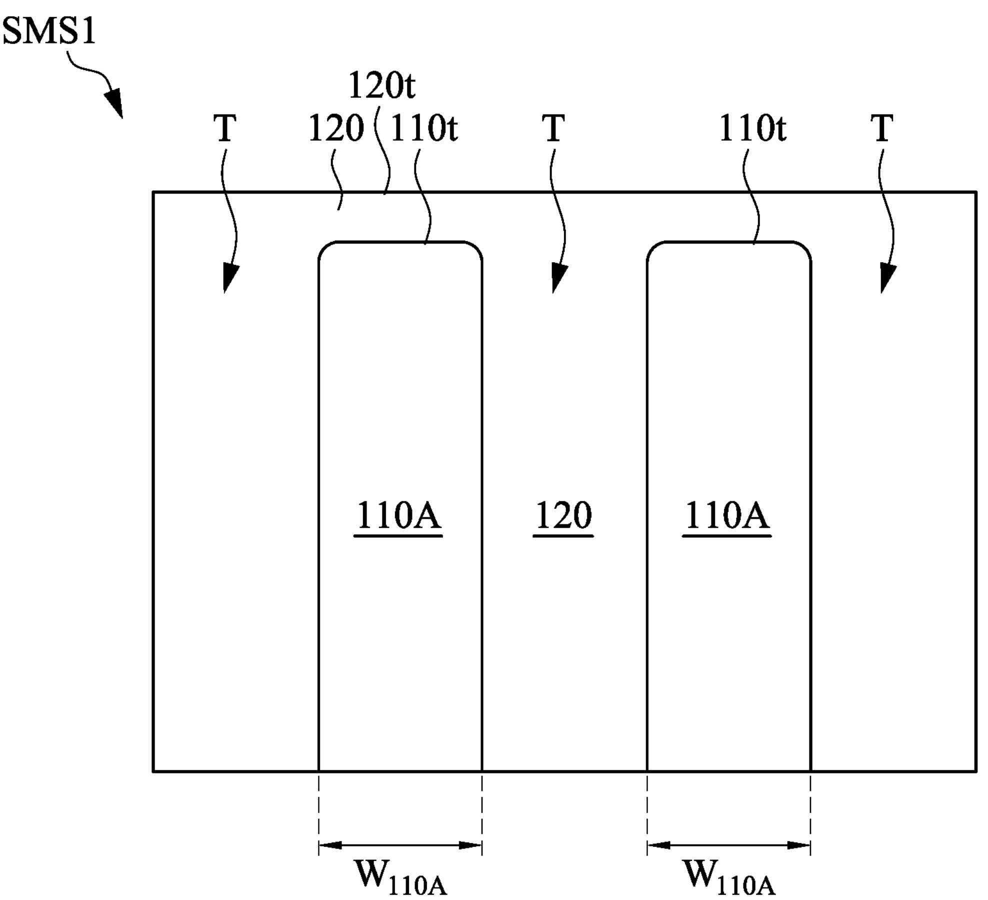
FIG. 2 is a cross-sectional view of an intermediate stage of manufacturing a semiconductor device in accordance with an embodiment of present disclosure.

In step S101, a semiconductor structure SMS1 is provided, as shown in FIG. 2.

Reference is made to FIG. 2. FIG. 2 is a cross-sectional view of an intermediate stage of manufacturing the semiconductor device 100 in accordance with an embodiment of present disclosure. As shown in FIG. 2, a semiconductor structure SMS1 is provided. In this embodiment, the semiconductor structure SMS1 includes a silicon substrate 110 and an oxide material 120 on the silicon substrate 110. In some embodiments, the silicon substrate 110 may be an active region (for example, a source/drain region). In some embodiments, the oxide material 120 is configured as shallow trench isolation (STI). More specifically, the silicon substrate 110 has a plurality of trenches T, and the trenches T define a plurality of island structures 110A, as shown in FIG. 2. For simplicity, FIG. 2 merely shows the island structures 110A of the silicon substrate 110 instead of the entire silicon substrate 110. As shown in FIG. 2, the oxide material 120 fills the trenches T of the silicon substrate 110.

As shown in FIG. 2, in some embodiments, the oxide material 120 is filled in the trenches T and covers the silicon substrate 110. More specifically, each of the island structures 110A has a top surface 110*t*, and the oxide material 120 has a top surface 120*t*. The oxide material 120 covers the island structure 110A of the silicon substrate 110, so that the top surface 120*t* of the oxide material 120 is higher than the top surface 110*t* of the island structures 110A.

As shown in FIG. 2, in some embodiments, each of the island structures 110A further has a width W110A. In some embodiments, the width W110A is substantially equal to a shortest distance between the two adjacent trenches T. In some embodiments, the width W110A of each of the island structures 110A is in a range between 20 nm and 30 nm.

In some embodiments, the method M further comprises planarizing the semiconductor structure SMS1. The step of planarizing the semiconductor structure SMS1 is performed after providing the semiconductor structure SMS1. More specifically, the oxide material 120 overfills the trenches T of the silicon substrate 110 during performing the step S101 and then planarized, such that the top surface 120*t* is formed accordingly, as shown in FIG. 2. In some embodiments, planarizing the semiconductor structure SMS1 is performed such that the top surface 120*t* of the oxide material 120 is paralleled to the top surface 110*t* of the island structures 110A.

Figure 3:
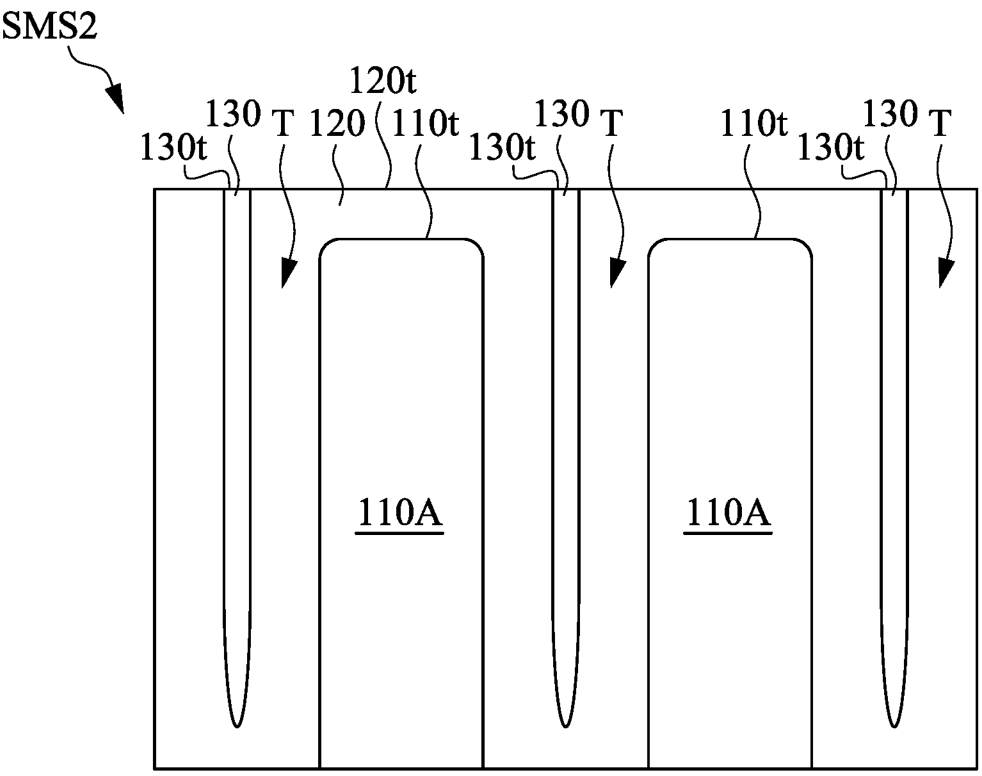
FIG. 3 is a cross-sectional view of an intermediate stage of manufacturing the semiconductor device in accordance with another embodiment of present disclosure.

Reference is made to FIG. 3. FIG. 3 is a cross-sectional view of an intermediate stage of manufacturing the semiconductor device 100A as shown in FIG. 7 in accordance with an embodiment of present disclosure. The configuration of the semiconductor device 100A and the configuration of the semiconductor device 100 are generally similar. The difference between the semiconductor device 100A and the semiconductor device 100 is that the semiconductor device 100A further includes a filling material 130 with respect to the semiconductor device 100, as shown in FIG. 6 and FIG. 7. As shown in FIG. 3, in another embodiment, the semiconductor structure SMS2 is provided during performing the step S101. In this embodiment, the semiconductor structure SMS2 further includes the silicon substrate 110, the oxide material 120, and the filling material 130. The filling material 130 is formed on the oxide material 120. More specifically, the filling material 130 is filled in seams or void of the oxide material 120 to improve the quality of shallow trench isolation (STI). As shown in FIG. 3, in some embodiments, forming the filling material 130 on the oxide material 120 is performed such that the trenches T are completely filled by the oxide material 120 and the filling material 130.

In some embodiments, the method M further comprises planarizing the semiconductor structure SMS2. The step of planarizing the semiconductor structure SMS2 is performed after providing the semiconductor structure SMS2. More specifically, the oxide material 120 and the filling material 130 overfill the trenches T of the silicon substrate 110 during performing the step S101 and then planarized, such that the top surface 120*t* of the oxide material 120 and a top surface 130*t* of the filling material 130 are formed accordingly, as shown in FIG. 3. In some embodiments, planarizing the semiconductor structure SMS2 is performed such that the top surface 120*t* of the oxide material 120 and the top surface 130*t* of the filling material 130 are coplanar, as shown in FIG. 3.

In some embodiments, the trenches T may be formed by any suitable method, for example, wet etching, dry etching, or the like. The present disclosure is not intended to limit the methods of forming the trench T.

In some embodiments, the silicon substrate 110 may be composed of silicon-based material. In some embodiments, the silicon substrate 110 may include a material, such as polysilicon, monocrystalline silicon, amorphous silicon, or the like. However, any suitable material may be utilized.

In some embodiments, the silicon substrate 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the silicon substrate 110.

In some embodiments, the oxide material 120 may be composed of oxide. In some embodiments, the oxide material 120 may include a material, such as silicon oxide ($SiO_2$), or the like. However, any suitable material may be utilized.

In some embodiments, the oxide material 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the oxide material 120.

In some embodiments, the filling material 130 may be composed of nitride. In some embodiments, the filling material 130 may include a material, such as titanium nitride (TiN), silicon nitride ($Si_xN_y$), or the like. However, any suitable material may be utilized.

In some embodiments, the filling material 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the filling material 130.

Figure 4:
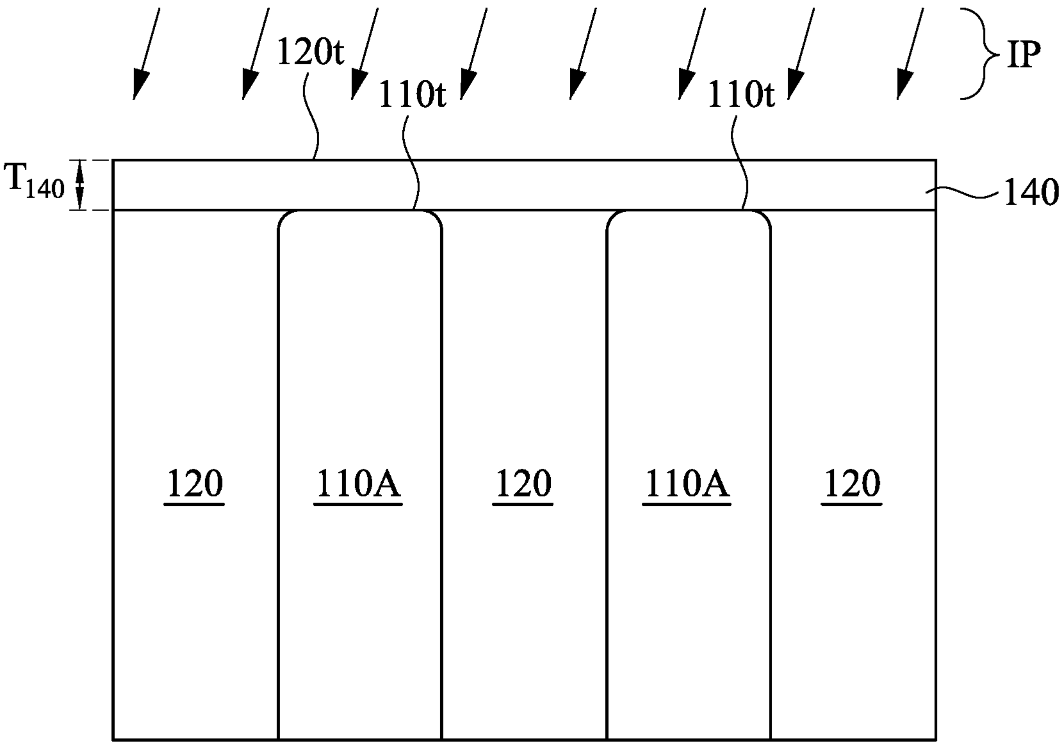
FIG. 4 is a cross-sectional view of an intermediate stage of manufacturing the semiconductor device in accordance with an embodiment of present disclosure.

In step S102, a pad oxide layer 140 is formed on a top portion of the oxide material 120, as shown in FIG. 4.

Reference is made to FIG. 4. FIG. 4 is a cross-sectional view of an intermediate stage of manufacturing the semiconductor device 100 in accordance with an embodiment of present disclosure. As shown in FIG. 4, the pad oxide layer 140 is located over the silicon substrate. More specifically, the pad oxide layer 140 is formed to cover the island structures 110A. In this embodiment, the pad oxide layer 140 is formed on the top portion of the oxide material 120 in situ. In other words, the oxide material 120 is not consumed during performing the step S102. As shown in FIG. 4, the pad oxide layer 140 is formed by a modification process IP. In some embodiments, the top portion of the oxide material 120 which is located on a side close to the top surface 120*t* of the oxide material 120 is exposed under the performing of the modification process IP. In some embodiments, the modification process IP is performed, such that an etch resistivity of the pad oxide layer 140 is greater than an etch resistivity of the oxide material 120. In some embodiments, the pad oxide layer 140 is configured as a protective layer of the semiconductor structure SMS1 to prevent the semiconductor structure SMS1 from being consumed.

In another embodiment, the filling material 130 may be included in the oxide material 120 shown in FIG. 4 that can be deduced from FIG. 3.

In some embodiments, the pad oxide layer 140 has a thickness $T_{140}$ after performing the modification process IP. In some embodiments, the thickness $T_{140}$ of the pad oxide layer 140 is from the top surface 120*t* of the oxide material 120 to the top surface 110*t* of the island structures 110A. In some embodiments, the thickness $T_{140}$ is in a range between 20 nm and 30 nm. In some embodiments, the thickness $T_{140}$ may be regarded as a scope where the modification process IP is performed. In other words, the modification process IP is preferably performed in a depth from the top surface 120*t* of the oxide material, in which the depth is preferably in a range between 20 nm and 30 nm. In some embodiments in which the aforementioned depth is less than 20 nm or greater than 30 nm, the pad oxide layer 140 may provide less effective protection for the semiconductor structure SMS1 or the semiconductor structure SMS2.

In some embodiments, the modification process IP may be any suitable method, for example, an ion implantation process, or the like. The present disclosure is not intended to limit the methods of forming the pad oxide layer 140.

In some embodiments, the pad oxide layer 140 may be composed of doped oxide. In some embodiments, the pad oxide layer 140 may include a material, such as doped silicon oxide ($SiO_2$), or the like. In some embodiments, the pad oxide layer 140 is implanted by using carbon ion as dopant. More specifically, forming the pad oxide layer 140 is performed by implanting carbon ion into the top portion of the oxide material 120. However, any suitable dopant may be utilized.

In step S103, The pad oxide layer 140 is removed.

Figure 5:
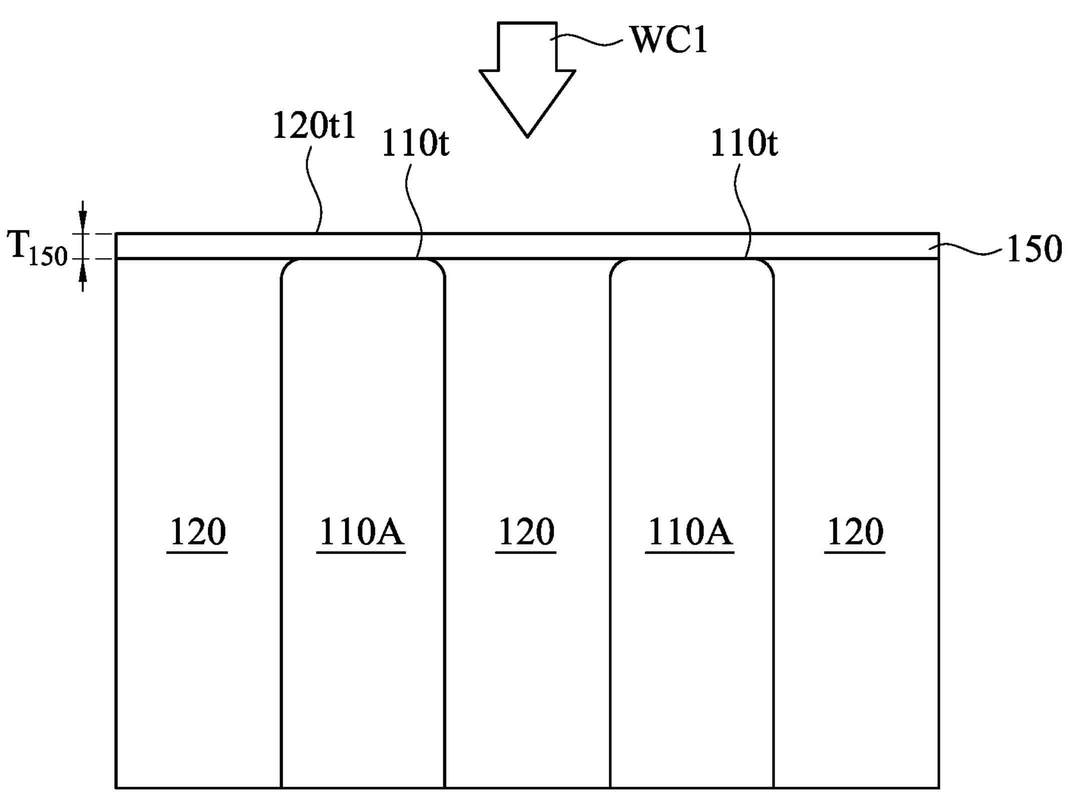
FIG. 5 is a cross-sectional view of an intermediate stage of manufacturing the semiconductor device in accordance with an embodiment of present disclosure.
Figure 6:
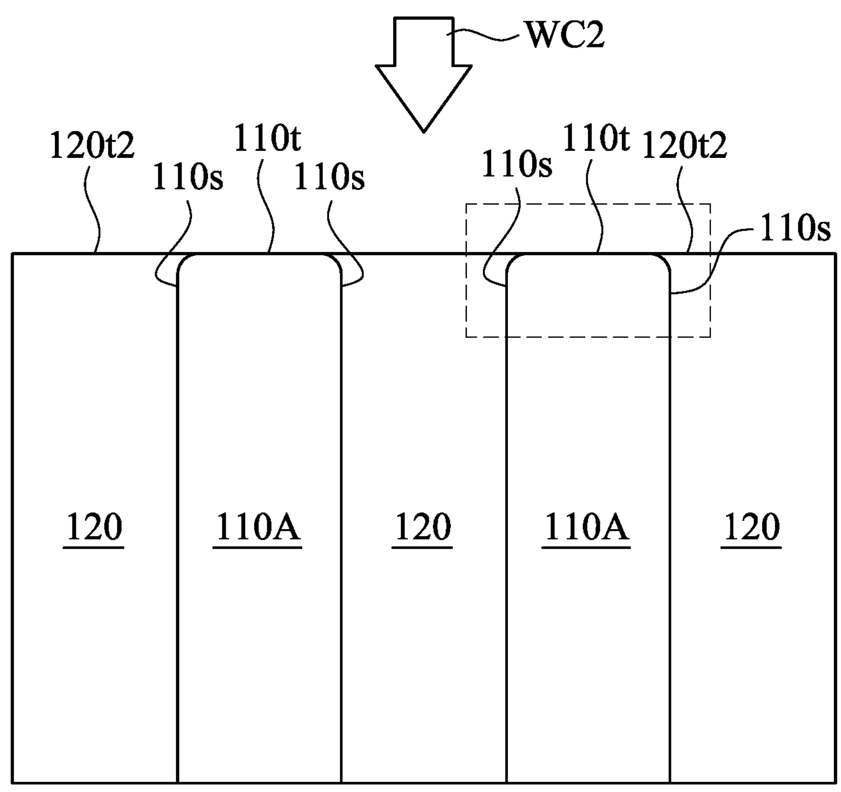
FIG. 6 is a cross-sectional view of an intermediate stage of manufacturing the semiconductor device in accordance with an embodiment of present disclosure.
Figure 7:
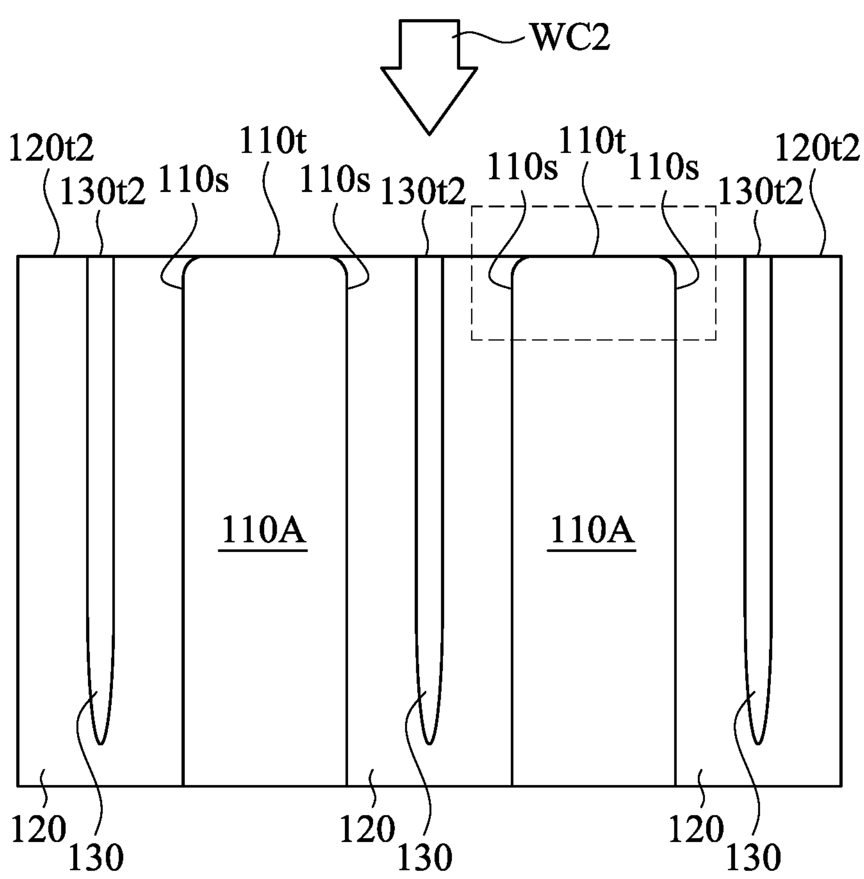
FIG. 7 is a cross-sectional view of an intermediate stage of manufacturing the semiconductor device in accordance with another embodiment of present disclosure.

Reference is made to FIG. 5 and FIG. 6. FIG. 5 and FIG. 6 are cross-sectional views of an intermediate stage of manufacturing the semiconductor device 100 in accordance with an embodiment of the present disclosure. In this embodiment, the pad oxide layer 140 is removed from the top portion of the oxide material 120. In some embodiments, the pad oxide layer 140 is removed by a cleaning process. After the step S103 is performed, the semiconductor device 100 is formed.

In some embodiments, the pad oxide layer 140 is removed by two steps of removal. More specifically, as shown in FIG. 5, a portion of the pad oxide layer 140 is removed by a cleaning process WC1, and then an intermediate pad oxide layer 150 is formed in situ. The cleaning process WC1 is performed, so that the intermediate pad oxide layer 150 has a thickness $T_{150}$ and a top surface 120*t*1. In some embodiments, the thickness $T_{150}$ of the intermediate pad oxide layer 150 is from the top surface 120*t*1 of the intermediate pad oxide layer 150 to the top surface 110*t* of the island structures 110A. In some embodiments, the top surface 120*t*1 is lower than the top surface 120*t* shown in FIG. 2, FIG. 3, and FIG. 4. In some embodiments, the thickness $T_{150}$ of the intermediate pad oxide layer 150 is less than the thickness $T_{140}$ of the pad oxide layer 140. Subsequently, as shown in FIG. 6, the intermediate pad oxide layer 150 is removed by a cleaning process WC2. The cleaning process WC2 is performed, so that the remaining oxide material 120 has a top surface 120*t*2. In some embodiments, the top surface 120*t*2 is lower than the top surface 120*t*1 shown in FIG. 5. In some embodiments, the pad oxide layer 140 (or, the intermediate pad oxide layer 150) is removed, such that the top surface 120*t*2 of the oxide material 120 and the top surface 110*t* of the island structures 110A are coplanar.

Removing the pad oxide layer 140 by the cleaning process WC1 and the cleaning process WC2 has some advantages. One of the advantages is that two-step removal prevents the risk of removal of oxide material 120 induced by over-etching the pad oxide layer 140.

In some embodiments, the cleaning process WC1 and the cleaning process WC2 are performed by using a wet cleaning process, for example, a wet etch process. The present disclosure is not intended to limit the methods of removing the pad oxide layer 140.

In some embodiments, the cleaning process WC1 and the cleaning process WC2 are performed by using, for example, hydrofluoric acid (HF) or the like. However, any suitable material of removing the pad oxide layer 140 may be utilized.

Reference is made to FIG. 7. FIG. 7 is a cross-sectional view of an intermediate stage of manufacturing the semiconductor device 100A in accordance with another embodiment of present disclosure. As shown in FIG. 7, in another embodiment, the semiconductor device 100A is formed after performing the step S103. In this embodiment, the semiconductor device 100A further includes the filling material 130 with respect to the semiconductor device 100 shown in FIG. 6, which can be deduced from FIGS. 3-6.

Figure 8:
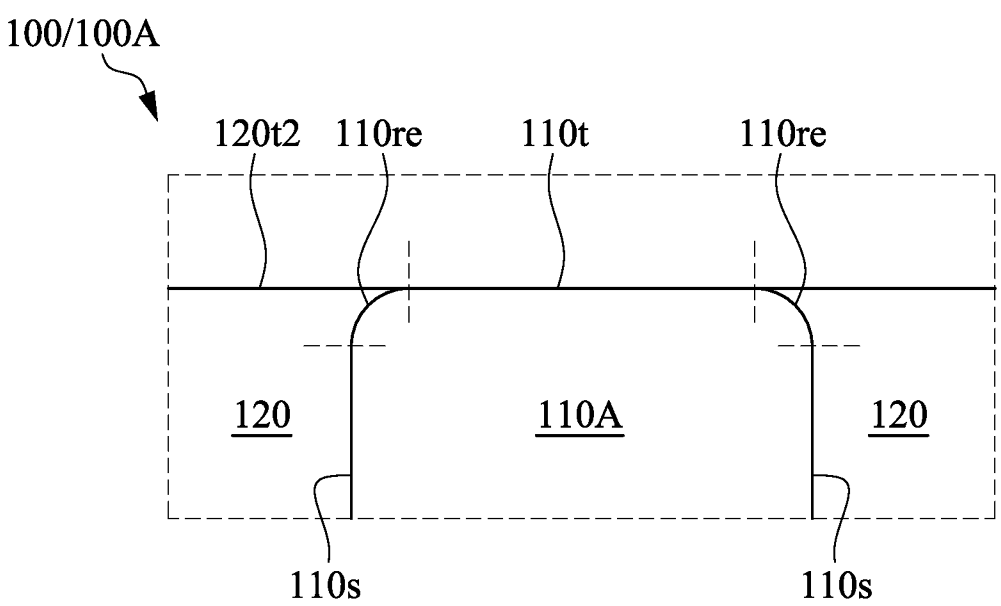
FIG. 8 is an enlarged cross-sectional view of FIG. 6 or FIG. 7 of an intermediate stage of manufacturing the semiconductor device in accordance with an embodiment of present disclosure.

Reference is made to FIG. 8. FIG. 8 is an enlarged cross-sectional view of FIG. 6 or FIG. 7 of an intermediate stage of manufacturing the semiconductor device 100 and the semiconductor device 100A in accordance with an embodiment of present disclosure. As shown in FIG. 8, each of the island structures 110A further has a side surface 110*s* and a rounded edge 110*re*. The top surface 110*t* of the island structures 110A refers to the surface coplanar with the top surface 120*t*2 of the oxide material 120. The side surface 110*s* of the island structures 110A refers to vertical lines located on two opposite sides of each of the island structures 110A shown in FIG. 8. The rounded edge 110*re* is connected between the top surface 110*t* and the side surface 110*s*. As shown in FIG. 8, the top surface 110*t*, the rounded edge 110*re*, and the side surface 110*s* are divided by dotted lines shown in FIG. 8.

In some embodiments, the rounded edge 110*re* has a radius of curvature. In some embodiments, the radius of curvature of the rounded edge 110*re* is equal or less than 2.3 nm. In some embodiments, the island structures 110A may not have the rounded edge 110*re* as the radius of curvature of the rounded edge 110*re* approaches to zero in theory. In some embodiments in which the radius of curvature of the rounded edge 110*re* is equal or less than 2.3 nm, a contact area between each of the island structures 110A and contacts formed on the island structures 110A in subsequent processes may be increased, thereby reducing the resistivity and improving the electrical performance of the semiconductor device 100 and the semiconductor device 100A.

By performing the method M shown in FIG. 1 of the present disclosure, the semiconductor device 100 and the semiconductor device 100A with better electrical performance may be formed.

Based on the above discussions, it can be seen that the semiconductor device and the method of manufacturing the same of the present disclosure provides island structures without rounding issues. In the semiconductor device and the method of manufacturing the same of the present disclosure, since the pad oxide layer is formed on the top of the semiconductor structure and covering the island structures, the loss of the oxide material can be reduced, thereby prevent rounding of the island structures. In the semiconductor device and the method of manufacturing the same of the present disclosure, since the pad oxide layer is formed on the top portion of the oxide material in situ, additional material is not required, thereby improving the electrical performance of the entire semiconductor device. To sum up, the method of manufacturing the semiconductor device of the present disclosure improves the overall electrical performance of the entire semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:

providing a semiconductor structure, wherein the semiconductor structure comprises a silicon substrate having a plurality of trenches and an oxide material filled in the trenches and covering the silicon substrate, and the trenches define a plurality of island structures;

forming a pad oxide layer on a top portion of the oxide material, wherein the pad oxide layer is located over the silicon substrate; and removing the pad oxide layer, so that a top surface of the oxide material and a top surface of the island structures are coplanar, wherein each of the island structures further has a side surface and a rounded edge connected between the top surface and the side surface, and a radius of curvature of the rounded edge is equal or less than 2.3 nm.

2. The method of claim 1, wherein each of the island structures has a width in a range between 20 nm and 30 nm.

3. The method of claim 1, wherein forming the pad oxide layer is performed by an ion implantation process.

4. The method of claim 1, wherein forming the pad oxide layer is performed by implanting carbon ion into the top portion of the oxide material.

5. The method of claim 1, wherein the pad oxide layer is formed on the top portion of the oxide material in situ.

6. The method of claim 1, wherein forming the pad oxide layer is performed such that the pad oxide layer has a thickness in a range between 20 nm and 30 nm.

7. The method of claim 1, further comprising planarizing the semiconductor structure performed after providing the semiconductor structure.

8. The method of claim 7, wherein planarizing the semiconductor structure is performed such that the top surface of the oxide material is paralleled to the top surface of the island structures.

9. The method of claim 1, wherein providing the semiconductor structure further comprises forming a filling material on the oxide material.

10. The method of claim 9, wherein forming the filling material on the oxide material is performed such that the trenches are completely filled by the oxide material and the filling material.

11. The method of claim 9, wherein the filling material is composed of nitride.

12. The method of claim 9, further comprising planarizing the semiconductor structure performed after forming the filling material.

13. The method of claim 12, wherein planarizing the semiconductor structure is performed such that the top surface of the oxide material and a top surface of the filling material are coplanar.

14. The method of claim 1, wherein removing the pad oxide layer is performed by a wet etch process.

15. The method of claim 14, wherein removing the pad oxide layer is performed by using hydrofluoric acid.

* * * * *